(12) United States Patent
Fukase

(10) Patent No.: US 10,971,592 B2
(45) Date of Patent: Apr. 6, 2021

(54) SEMICONDUCTOR DEVICE WITH GATE ELECTRODE HAVING SIDE SURFACES DOPED WITH CARBON

(71) Applicant: Toshiba Memory Corporation, Tokyo (JP)

(72) Inventor: Kazuya Fukase, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 169 days.

(21) Appl. No.: 16/279,995

(22) Filed: Feb. 19, 2019

(65) Prior Publication Data

US 2020/0066862 A1   Feb. 27, 2020

(30) Foreign Application Priority Data

Aug. 27, 2018 (JP) .............................. JP2018-158418

(51) Int. Cl.
*H01L 29/49* (2006.01)
*H01L 29/423* (2006.01)
*H01L 21/28* (2006.01)
*H01L 29/66* (2006.01)
*H01L 21/3215* (2006.01)
*H01L 21/3213* (2006.01)
(Continued)

(52) U.S. Cl.
CPC .... *H01L 29/4925* (2013.01); *H01L 21/28035* (2013.01); *H01L 29/4238* (2013.01); *H01L 29/42376* (2013.01); *H01L 21/0214* (2013.01); *H01L 21/0217* (2013.01); *H01L 21/02164* (2013.01); *H01L 21/02271* (2013.01); *H01L 21/02326* (2013.01); *H01L 21/26513* (2013.01); *H01L 21/26586* (2013.01); *H01L 21/31111* (2013.01); *H01L 21/32137* (2013.01); *H01L 21/32155* (2013.01); *H01L 29/0847* (2013.01); *H01L 29/66568* (2013.01)

(58) Field of Classification Search
CPC .......... H01L 29/4925; H01L 29/42376; H01L 29/4238; H01L 29/0847; H01L 29/66568; H01L 21/28035
See application file for complete search history.

(56) References Cited

U.S. PATENT DOCUMENTS 5,189,504 A * 2/1993 Nakayama .......... H01L 21/2807
257/422
7,157,341 B2   1/2007 Martin et al.
(Continued)

FOREIGN PATENT DOCUMENTS

JP   H07-030108 A   1/1995
JP   H09-017996 A   1/1997
JP   2011-086861 A   4/2011

*Primary Examiner* — Lex H Malsawma
(74) *Attorney, Agent, or Firm* — Foley & Lardner LLP

(57) ABSTRACT

A semiconductor device includes a gate insulating film on a semiconductor substrate, and a gate electrode on the gate insulating film. The gate electrode includes a first layer containing polycrystalline silicon, a second layer between the first layer and the gate insulating film and containing polycrystalline silicon and carbon, a third layer on an upper surface of the first layer and containing polycrystalline silicon and carbon, a fourth layer on a first side surface of the first layer and containing polycrystalline silicon and carbon, and a fifth layer on a second side surface of the first layer and containing polycrystalline silicon and carbon.

20 Claims, 12 Drawing Sheets

(51) Int. Cl.
  *H01L 21/02* (2006.01)
  *H01L 21/265* (2006.01)
  *H01L 21/311* (2006.01)
  *H01L 29/08* (2006.01)

(56) References Cited

U.S. PATENT DOCUMENTS

| | | | |
|---|---|---|---|
| 7,736,968 B2* | 6/2010 | Ku | H01L 21/26506 |
| | | | 438/231 |
| 8,421,130 B2* | 4/2013 | Liaw | H01L 27/1104 |
| | | | 257/288 |
| 8,587,060 B2* | 11/2013 | Tsuchiya | H01L 29/66068 |
| | | | 257/341 |
| 9,123,747 B2* | 9/2015 | Sonehara | H01L 29/513 |
| 9,171,854 B2* | 10/2015 | Kim | H01L 29/42324 |
| 9,378,977 B2* | 6/2016 | Kim | H01L 27/1157 |
| 2004/0002185 A1* | 1/2004 | Takahashi | H01L 21/823842 |
| | | | 438/224 |
| 2004/0262694 A1* | 12/2004 | Chidambaram | H01L 29/7848 |
| | | | 257/369 |
| 2005/0158932 A1 | 7/2005 | Unumiya et al. | |
| 2006/0121660 A1* | 6/2006 | Rhee | H01L 21/28052 |
| | | | 438/197 |
| 2007/0148888 A1* | 6/2007 | Krull | H01L 21/26566 |
| | | | 438/306 |
| 2011/0215426 A1 | 9/2011 | Okayama et al. | |

* cited by examiner

SEMICONDUCTOR DEVICE WITH GATE ELECTRODE HAVING SIDE SURFACES DOPED WITH CARBON

CROSS-REFERENCE TO RELATED APPLICATIONS

This application is based upon and claims the benefit of priority from Japanese Patent Application No. 2018-158418, filed Aug. 27, 2018, the entire contents of which are incorporated herein by reference.

FIELD

Embodiments described herein relate generally to a semiconductor device, and particular to a semiconductor device which includes an MIS (metal insulator semiconductor) transistor.

BACKGROUND

An MIS transistor (field effect transistor) is used in various semiconductor devices (in particular, LSI (large-scale integrated circuit)). The MIS transistor is desirably made to be miniaturized and have a low resistance. The performance of the LSI can be achieved by improving the characteristics of the MIS transistor.

DETAILED DESCRIPTION

At least one embodiment provides a semiconductor device with improved performance.

In general, according to at least one embodiment, the semiconductor device includes a semiconductor substrate, a gate insulating film which is provided on the semiconductor substrate, and a gate electrode which is provided on the gate insulating film. The gate electrode includes a first layer which contains polycrystalline silicon, a second layer which is provided between the first layer and the gate insulating film, and contains polycrystalline silicon and carbon, a third layer which is provided on an upper surface of the first layer, and contains polycrystalline silicon and carbon, a fourth layer which is provided on a first side surface of the first layer, and contains polycrystalline silicon and carbon, and a fifth layer which is provided on a second side surface of the first layer, and contains polycrystalline silicon and carbon.

Hereinafter, the embodiments will be described with reference to the drawings. The embodiments below are given to exemplify a device and a method to specify the technical ideas of the embodiment. The shapes, structures, and layouts of the components are not intended to limit the technical ideas of the embodiment. The drawings are drawn schematically and conceptually. A relation between thicknesses and widths of each portion, and a ratio of the sizes between the portions are not necessarily equal to the actual dimensions. In addition, even the same portion may be illustrated in different dimensions or ratios in another drawing. In the description below, the same functions and components will be attached with the same symbols, and the detailed description will be appropriately omitted, and the different portions will be described.

Discussion

Figure 1:
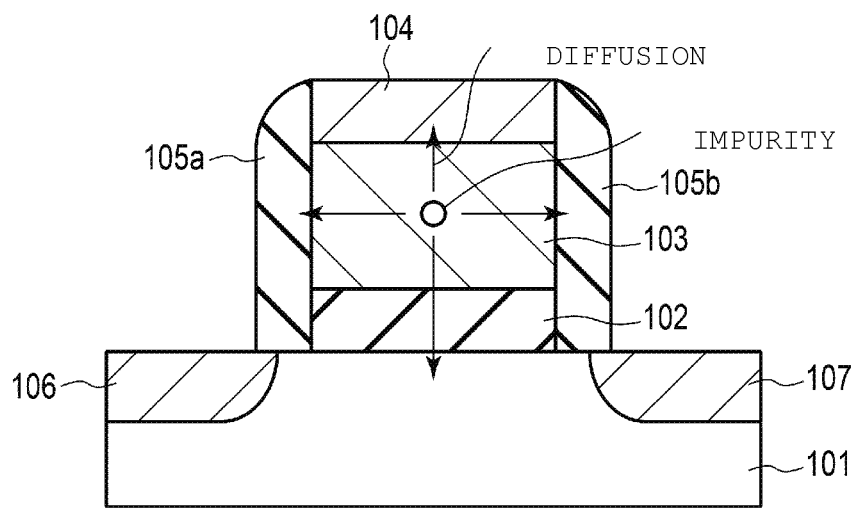
FIG. 1 is a cross-sectional view illustrating an MIS transistor according to a first comparative example.

FIG. 1 is a cross-sectional view illustrating an MIS transistor according to a first comparative example.

A gate insulating film 102 is provided on a semiconductor substrate 101. A gate electrode 103 is provided on the gate insulating film 102. The gate electrode 103 includes polycrystalline silicon. A silicide layer 104 is provided on the gate electrode 103. Side walls 105a and 105b are provided on both sides of the gate electrode 103. In the semiconductor substrate 101 and the regions on the lateral lower sides of the side walls 105a and 105b, a source region 106 and a drain region 107 are provided.

A conductive gate electrode is formed by introducing impurities to a polycrystalline silicon layer 103. As the impurities to be introduced to the polycrystalline silicon layer, a P-type impurity (for example, boron (B)) is used in a P-type MIS transistor, and an N-type impurity (for example, phosphorus (P) or arsenic (As)) is used in an N-type MIS transistor.

For example, the MIS transistor is subjected to heating treatment. Therefore, there is a concern that the impurities are diffused into the polycrystalline silicon layer. When the impurities penetrate the gate insulating film 102 to enter the semiconductor substrate 101, a threshold voltage Vth of the MIS transistor varies.

In addition, when the impurities are absorbed to the silicide layer 104, an impurity concentration of the polycrystalline silicon layer 103 is lowered, and the polycrystalline silicon layer 103 is depleted. Similarly, when the impurities are absorbed to the side walls 105a and 105b, the impurity concentration of the polycrystalline silicon layer 103 is lowered, and the polycrystalline silicon layer 103 is depleted.

In addition, the silicide layer 104 has a function of reducing the resistance of the gate electrode. When a gate length is made short, the width of the silicide layer 104 is narrowed. Therefore, a sheet resistance of the gate electrode becomes large by the thinning effect of the silicide layer 104.

Figure 2:
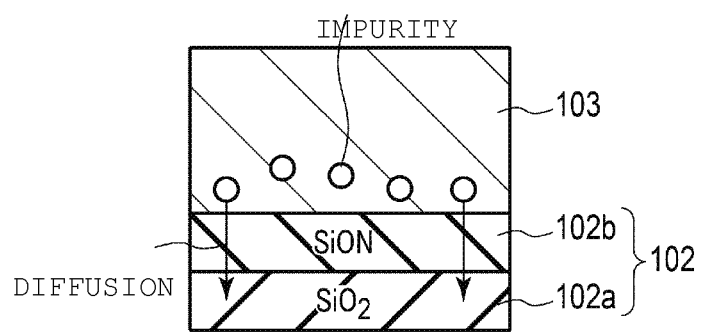
FIG. 2 is a cross-sectional view partially illustrating the MIS transistor according to a second comparative example.

FIG. 2 is a cross-sectional view partially illustrating the MIS transistor according to a second comparative example. In the second comparative example, in order to prevent that the impurities penetrate the gate insulating film 102, the surface of a silicon oxide film ($SiO_2$) as the gate insulating film 102 is nitrided to form the gate insulating film 102 with two layers (a silicon oxide film 102a and a silicon oxynitride film (SiON)). However, the diffusion of the impurities toward the side surface and the upper surface of the polycrystalline silicon layer 103 is not prevented in the configuration of FIG. 2.

Figure 3:
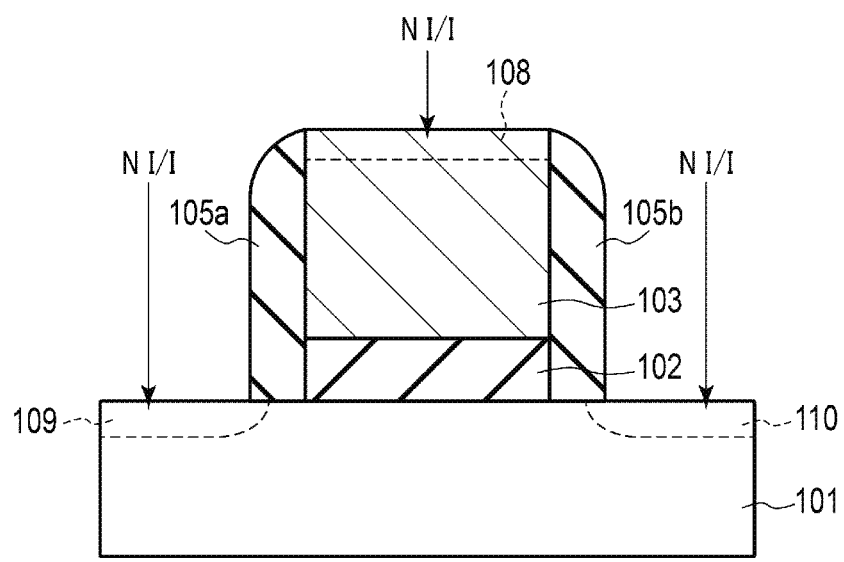
FIG. 3 is a cross-sectional view illustrating the MIS transistor according to a third comparative example.

FIG. 3 is a cross-sectional view illustrating the MIS transistor according to a third comparative example. In the third comparative example, nitride (N) ions (or carbon (C) ions) are implanted (I/I) to the polycrystalline silicon layer 103 and the semiconductor substrate 101 in order to reduce the thinning effect of the silicide layer, and to improve heat resistance of the MIS transistor. Regions 108 to 110 in FIG. 3 are regions where nitride (N) is introduced. However, the diffusion of the impurities toward the side surface and the bottom surface of the polycrystalline silicon layer 103 is not prevented in the configuration of FIG. 3.

Figure 4:
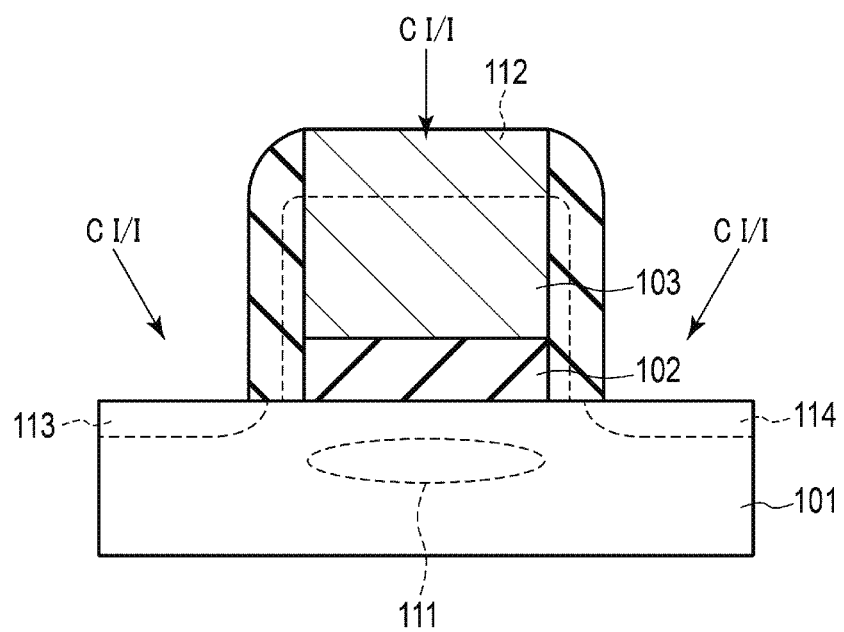
FIG. 4 is a cross-sectional view illustrating the MIS transistor according to a fourth comparative example.

FIG. 4 is a cross-sectional view illustrating the MIS transistor according to a fourth comparative example. In the fourth comparative example, carbon (C) is introduced into the semiconductor substrate 101 and to the lower side of the gate insulating film 102 in order to prevent the short channel effect. Regions 111 to 114 in FIG. 4 are where carbon (C) is introduced. The diffusion of the impurities can be prevented by introducing carbon (C) to the region 111 of the semiconductor substrate 101. However, in the configuration of FIG. 4, carbon (C) is also introduced to the regions 113 and 114 where the source region and the drain region are formed. Therefore, the interface resistance between silicide and silicon is increased.

The embodiments will be described below in view of such considerations.

[1] First Embodiment

[1-1] Configurations of Semiconductor Device 1

Figure 5:
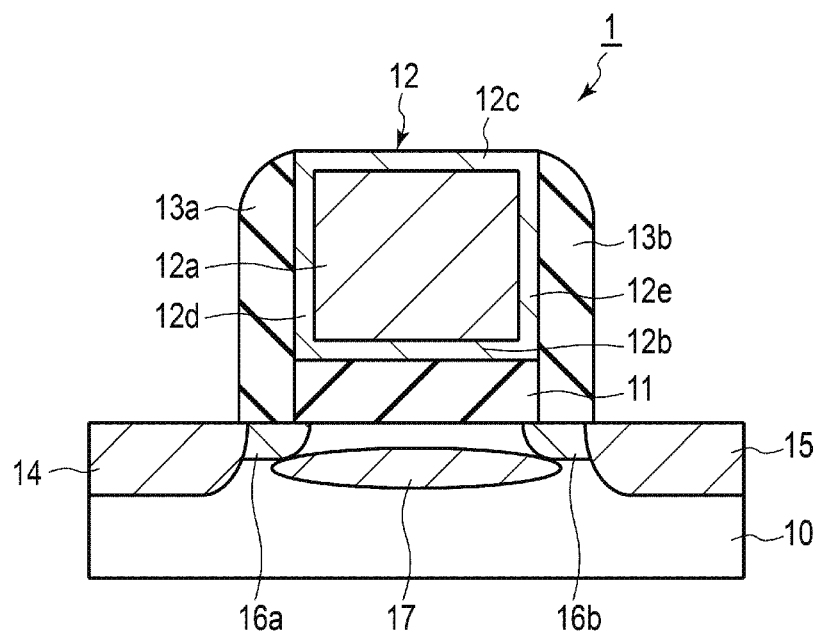
FIG. 5 is a cross-sectional view illustrating a semiconductor device according to at least one embodiment.

FIG. 5 is a cross-sectional view of a semiconductor device 1 according to at least one embodiment. As the semiconductor device 1, a P-type MIS (metal insulator semiconductor) transistor will be described as an example. This embodiment can also be applied to the N-type MIS transistor. The N-type MIS transistor is configured by reversing the conductive types of the elements of the P-type MIS transistor.

A semiconductor substrate 10 is, for example, a silicon substrate. An N-type well is formed in the surface region of the semiconductor substrate 10. The N-type well is a low-concentrated impurity region which is formed by introducing N-type impurities to the surface region of the semiconductor substrate 10.

A gate insulating film 11 is provided on the semiconductor substrate 10. A silicon oxide ($SiO_2$) is used as the gate insulating film 11 for example.

A gate electrode 12 is provided on the gate insulating film 11. The gate electrode 12 includes a polycrystalline silicon layer 12a, and C-doped layers 12b to 12e which is formed by introducing carbon (C) to polycrystalline silicon (polysilicon). The C-doped layer 12b is provided on the bottom surface of the polycrystalline silicon layer 12a. The C-doped layer 12c is provided on the upper surface of the polycrystalline silicon layer 12a. The C-doped layer 12d is provided on one side surface of the polycrystalline silicon layer 12a. The C-doped layer 12e is provided on the other side surface of the polycrystalline silicon layer 12a. That is, the gate electrode 12 has a structure in which the polycrystalline silicon layer 12a is wrapped with the C-doped layers 12b to 12e.

In the case of the P-type MIS transistor, the polycrystalline silicon layer 12a contains P-type impurities (for example, boron (B)). In the case of the N-type MIS transistor, the polycrystalline silicon layer 12a contains N-type impurities (for example, phosphorus (P) or arsenic (As)).

Side walls 13a and 13b are provided on both side surfaces of the gate electrode 12 respectively. The side walls 13a and 13b include an insulating material, which may be, for example, a silicon oxide ($SiO_2$).

A source region 14 and a drain region 15 are provided in the semiconductor substrate 10 and the lateral lower sides of the side walls 13a and 13b respectively. The source region 14 and the drain region 15 are a high-concentrated impurity region which is formed by introducing P-type impurities (for example, boron (B)) to the semiconductor substrate 10.

Extension regions 16a and 16b are provided in the semiconductor substrate 10 and both lateral lower sides of the gate insulating film 11 respectively. The extension regions 16a and 16b are a low-concentrated impurity region which is formed by introducing P-type impurities (for example, boron (B)) to the semiconductor substrate 10. The impurity concentration of the extension region 16a (or the extension region 16b) is lower than the impurity concentration of the source region 14 (or the drain region 15). The depth of the extension region 16a (or the extension region 16b) is shallower than that of the source region 14 (or the drain region 15). The depth of the extension region is a depth when the impurity concentration of a P-type extension region and the impurity concentration of the N-type well are equal. The depth of the source region is a depth when the impurity concentration of the source region and the impurity concentration of the N-type well are equal. The extension regions 16a and 16b have a function of alleviating the electrical field around a channel region.

A halo region 17 is provided on the lower side of the gate insulating film 11 and between the extension regions 16a and 16b. The halo region 17 is a high-concentrated impurity region which is formed by introducing an N-type impurity (for example, phosphorus (P) or arsenic (As)) to the semiconductor substrate 10 and has a concentration higher than that of the N-type well. The halo region 17 has a function of reducing the short channel effect.

In the semiconductor device 1 configured as described above, the C-doped layers 12b to 12e contained in the gate electrode 12 have a function of preventing the diffusion of the impurities (for example, boron (B)) contained in the polycrystalline silicon layer 12a.

Each of the C-doped layers 12b to 12e is provided such that the concentration of carbon (C) is equal to or more than $1 \times 10^{20}/cm^3$. When the concentration of carbon (C) is equal to or more than $1 \times 10^{20}/cm^3$, the diffusion of the impurities (for example, boron (B)) contained in the polycrystalline silicon layer 12a can be prevented by each of the C-doped layers 12b to 12e.

The thickness of each of the C-doped layers 12b to 12e is desirably set to be equal to or less than 5 nm. When the thickness of each of the C-doped layers 12b to 12e is 5 nm, the diffusion of the impurities can be prevented. In this embodiment, the thickness of each of the C-doped layers 12b to 12e is set to be equal to or less than 5 nm. Even when the thickness of each of the C-doped layers 12b to 12e is equal to or less than 5 nm, the diffusion of the impurities can be prevented. In addition, the size of the polycrystalline silicon layer 12a can be made large by thinning the thickness of each of the C-doped layers 12b to 12e.

[1-2] Manufacturing Method of Semiconductor Device 1

Next, a manufacturing method of the semiconductor device 1 according to the first embodiment will be described.

Figure 6:
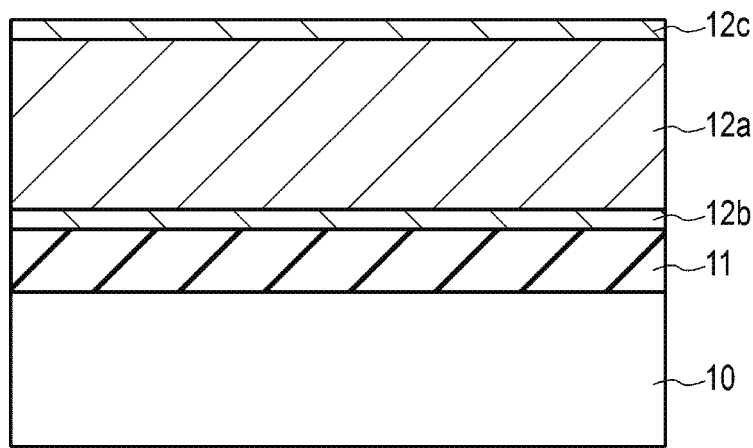
FIG. 6 is a cross-sectional view for describing a manufacturing process of the semiconductor device according to at least one embodiment.

As illustrated in FIG. 6, the gate insulating film 11, the C-doped layer 12b which is formed by introducing carbon (C) to polycrystalline silicon, the polycrystalline silicon layer 12a, and the C-doped layer 12c are deposited on the semiconductor substrate 10 in this order. For example, the C-doped layers 12b and 12c are formed by implanting carbon (C) ions to the polycrystalline silicon layer after the polycrystalline silicon layer is formed.

Figure 7:
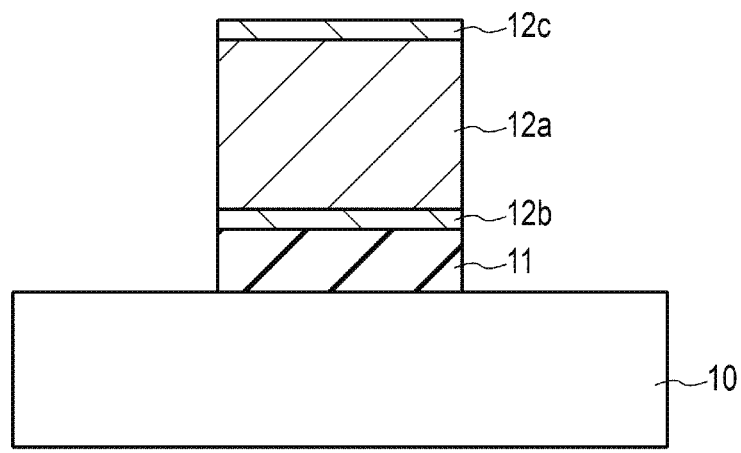
FIG. 7 is a cross-sectional view for describing the manufacturing process of the semiconductor device performed subsequent to FIG. 6.

As illustrated in FIG. 7, the gate insulating film 11, the C-doped layer 12b, the polycrystalline silicon layer 12a, and the C-doped layer 12c are formed in a desired shape (for example, a rectangular flat shape) by lithography processing and RIE (reactive ion etching).

Figure 8:
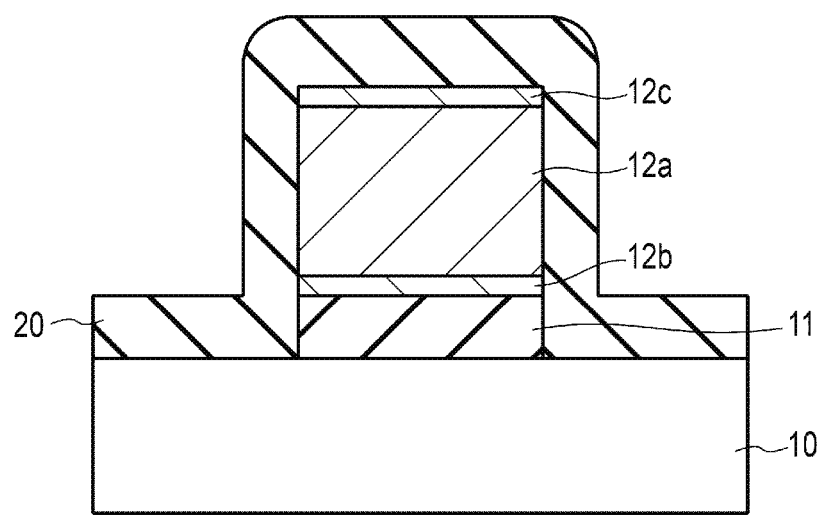
FIG. 8 is a cross-sectional view for describing the manufacturing process of the semiconductor device performed subsequent to FIG. 7.

As illustrated in FIG. 8, for example, the entire surface of the device is deposited with an insulating film 20 (for example, a silicon nitride (SiN)) by a CVD (chemical vapor deposition) method.

Figure 9:
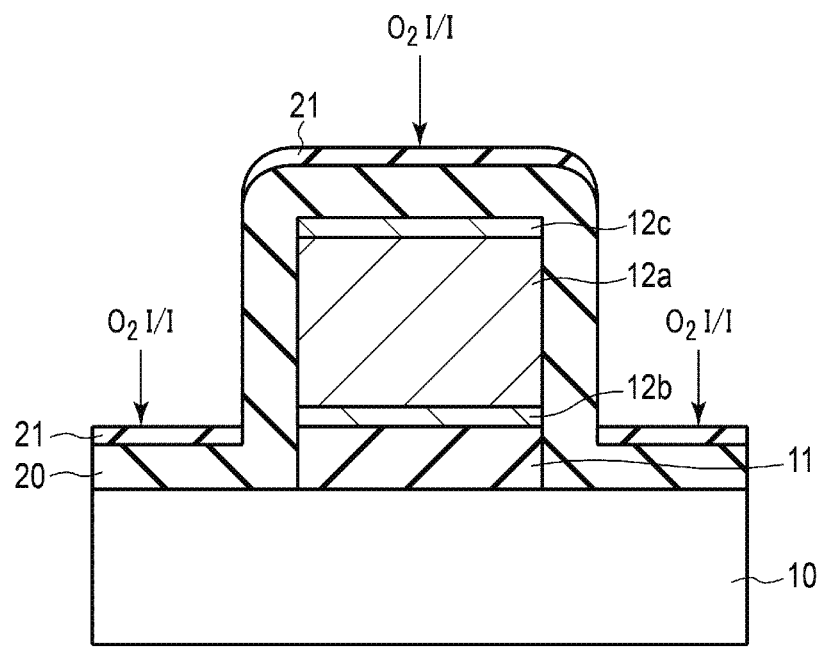
FIG. 9 is a cross-sectional view for describing the manufacturing process of the semiconductor device performed subsequent to FIG. 8.

As illustrated in FIG. 9, oxygen ($O_2$) ions are implanted to the surface of the insulating film 20 in a vertical direction (in the drawing, the ion implantation is denoted as I/I). With this configuration, an insulating film 21 made of SiON is formed on the surface of the insulating film 20. Further, a SiON film is not formed on the side surface of the insulating film 20. The insulating film (SiON film) 21 to which oxygen is introduced has resistance against an etching liquid to be used in the next process.

Figure 10:
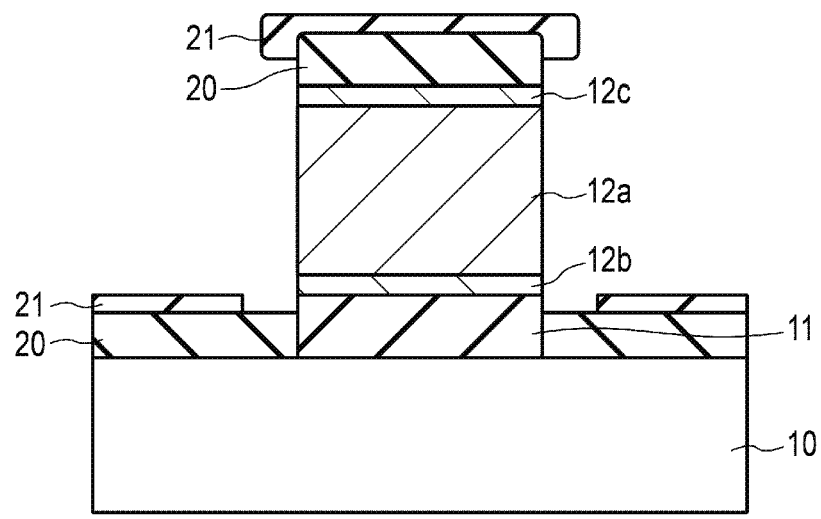
FIG. 10 is a cross-sectional view for describing the manufacturing process of the semiconductor device performed subsequent to FIG. 9.

As illustrated in FIG. 10, the device is subjected to the wet etching, for example, using hot phosphoric acid ($H_3PO_4$) as an etchant. With this configuration, a SiN film formed on the side surface of the polycrystalline silicon layer 12a is removed. The side surface of the polycrystalline silicon layer 12a is exposed. The SiN film 20 formed on the semiconductor substrate 10 and the SiN film 20 formed on the C-doped layer 12c are protected by the SiON film 21, and thus these are remained.

Figure 11:
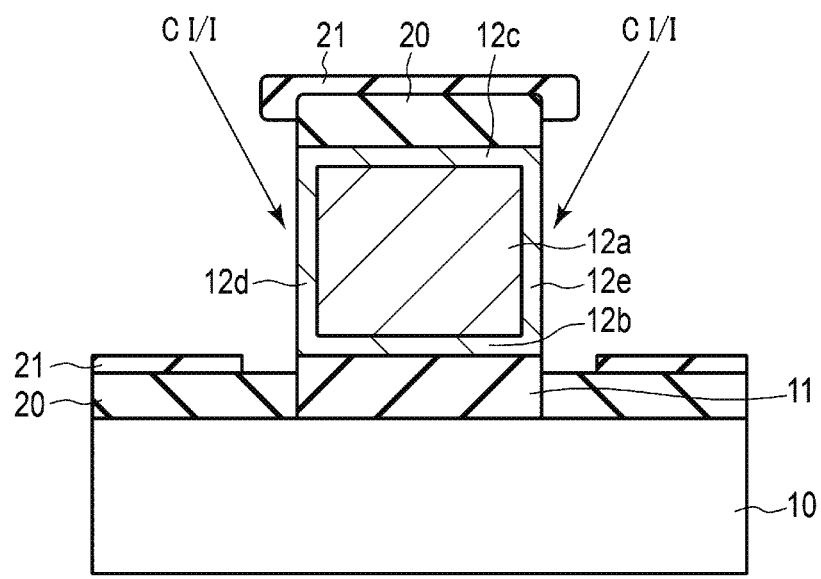
FIG. 11 is a cross-sectional view for describing the manufacturing device of the semiconductor device performed subsequent to FIG. 10.

As illustrated in FIG. 11, carbon (C) ions are implanted to both side surfaces of the polycrystalline silicon layer 12a at an inclined implantation angle using the SiN film 20 and the SiON film 21 as a mask. With this configuration, the C-doped layers 12d and 12e are formed on both side surfaces of the polycrystalline silicon layer 12a respectively. In the process of introducing carbon (C), a carbon cluster ions implantation is used for example.

At this time, the semiconductor substrate 10 is protected by the insulating films 20 and 21. Therefore, it is possible to prevent that carbon (C) is introduced to the semiconductor substrate 10. In addition, the C-doped layer 12c provided on the upper surface of the polycrystalline silicon layer 12a is protected by the insulating films 20 and 21. Therefore, it is possible to prevent the carbon (C) from further being introduced to the C-doped layer 12c. It is possible to prevent the thickness of the C-doped layer 12c from increasing.

Figure 12:
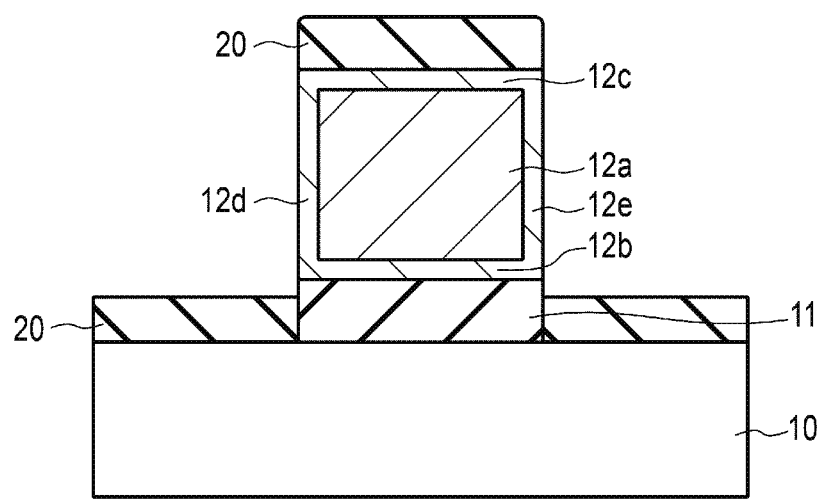
FIG. 12 is a cross-sectional view for describing the manufacturing device of the semiconductor device performed subsequent to FIG. 11.

As illustrated in FIG. 12, the device is subjected to the wet etching using diluted hydrofluoric acid (DHF) for example. With this configuration, the SiON film 21 is removed.

Figure 13:
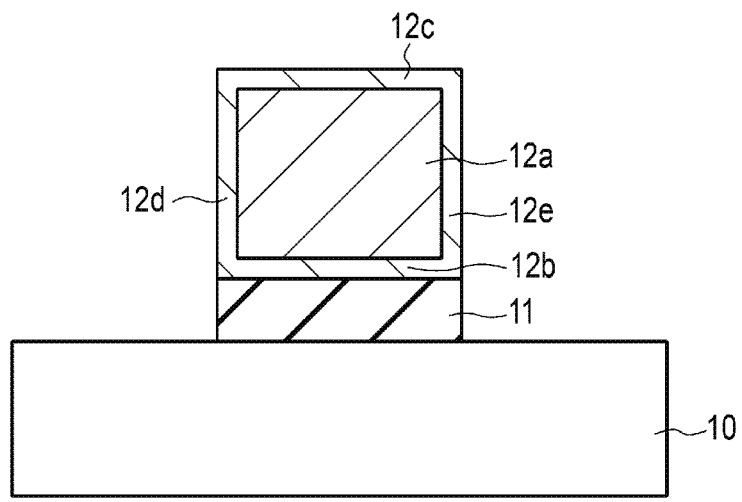
FIG. 13 is a cross-sectional view for describing the manufacturing process of the semiconductor device performed subsequent to FIG. 12.

As illustrated in FIG. 13, the device is subjected to the wet etching using hot phosphoric acid ($H_3PO_4$) for example. With this configuration, the SiN film 20 is removed.

Figure 14:
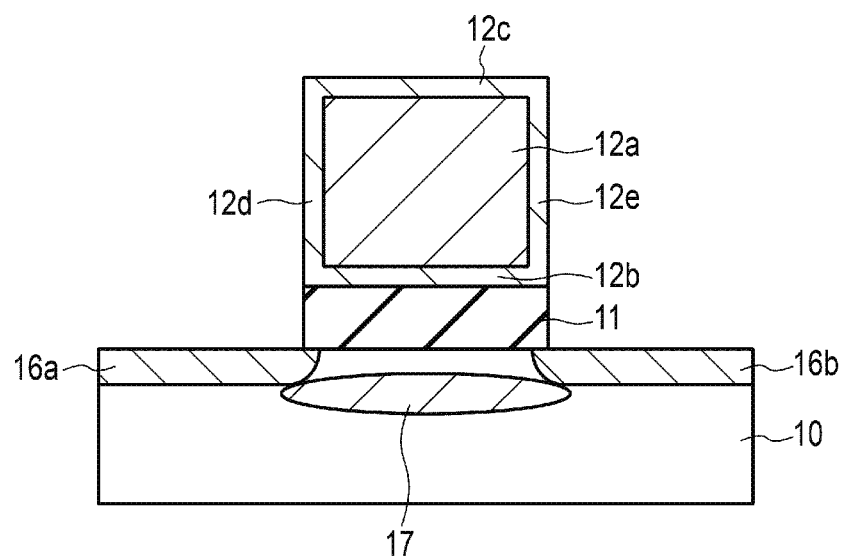
FIG. 14 is a cross-sectional view for describing the manufacturing process of the semiconductor device performed subsequent to FIG. 13.

As illustrated in FIG. 14, the extension regions 16a and 16b and the halo region 17 are formed in the semiconductor substrate 10 using a photo lithography processing. The extension regions 16a and 16b are formed by implanting ions of P-type impurities (for example, boron (B)). The halo region 17 is formed by implanting ions of N-type impurities (for example, phosphorus (P) or arsenic (As)).

Figure 15:
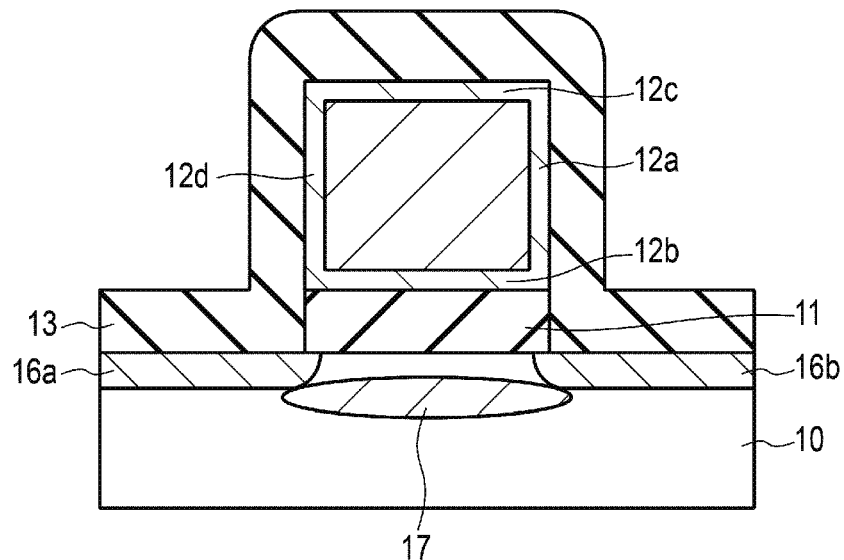
FIG. 15 is a cross-sectional view for describing the manufacturing process of the semiconductor device performed subsequent to FIG. 14.

As illustrated in FIG. 15, for example, an insulating film 13 (for example, a silicon oxide ($SiO_2$)) is deposited in the entire surface of the device by the CVD method.

Figure 16:
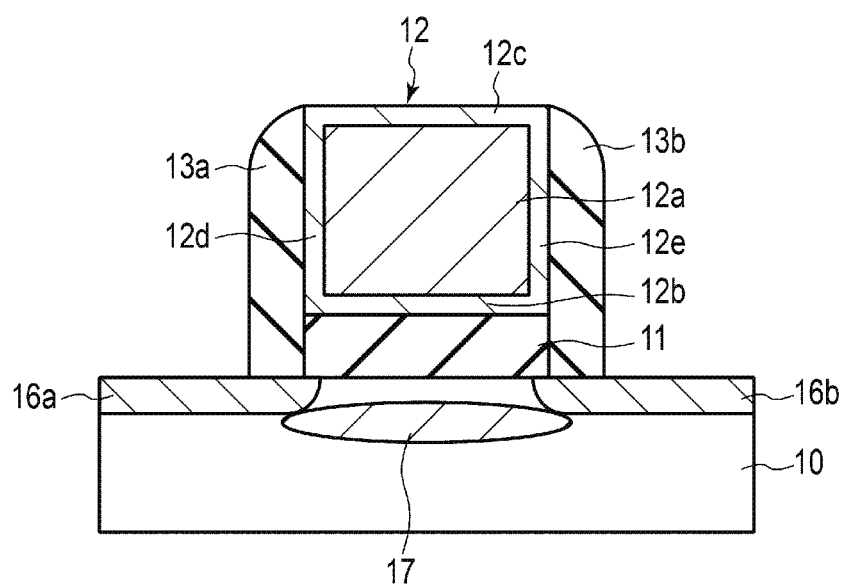
FIG. 16 is a cross-sectional view for describing the manufacturing process of the semiconductor device performed subsequent to FIG. 15.

As illustrated in FIG. 16, for example, the insulating film 13 is formed by the RIE. With this configuration, the side walls 13a and 13b are formed on both side surfaces of the gate electrode 12 respectively.

As illustrated in FIG. 5, the source region 14 and the drain region 15 are formed in the semiconductor substrate 10 using the photo lithography processing. The source region 14 and the drain region 15 are formed by implanting ions of P-type impurities (for example, boron (B)).

Therefore, the semiconductor device 1 according to the first embodiment is manufactured.

Further, in the above manufacturing method, the C-doped layers 12d and 12e are formed by implanting carbon (C) ions in both side surfaces of the polycrystalline silicon layer 12a. As another manufacturing method, a C-doped layer where carbon (C) is introduced to polycrystalline silicon may be deposited in both side surfaces of the polycrystalline silicon layer 12a to form the C-doped layers 12d and 12e.

[1-3] Effects of First Embodiment

As described above, in the first embodiment, the semiconductor device 1 includes the semiconductor substrate 10, the gate insulating film 11 which is formed on the semiconductor substrate 10, and the gate electrode 12 which is formed on the gate insulating film 11. The gate electrode 12 includes the polycrystalline silicon layer 12a, the C-doped layer 12b which is provided on the bottom surface of the polycrystalline silicon layer 12a, and contains polycrystalline silicon and carbon, the C-doped layer 12c which is provided on the upper surface of the polycrystalline silicon layer 12a, and contains polycrystalline silicon and carbon, the C-doped layer 12d which is provided on the first side surface of the polycrystalline silicon layer 12a, and contains polycrystalline silicon and carbon, and the C-doped layer 12e which is provided on the second side surface of the polycrystalline silicon layer 12a, and contains polycrystalline silicon and carbon.

Therefore, according to the first embodiment, it is possible to prevent the impurities (for example, boron (B)) contained in the polycrystalline silicon layer 12a from penetrating the gate insulating film 11 to enter the semiconductor substrate 10. With this configuration, it is possible to prevent a variation in the threshold voltage Vth of the MIS transistor.

In addition, it is possible to prevent the impurities contained in the polycrystalline silicon layer 12a from being absorbed to the side walls 13a and 13b. With this configuration, it is possible to lower the concentration of the impurities contained in the polycrystalline silicon layer 12a. Therefore, it is possible to prevent the polycrystalline silicon layer 12a from being depleted.

In addition, it is possible to prevent the impurities contained in the polycrystalline silicon layer 12a from being absorbed to the silicide layer (not illustrated). With this configuration, it is possible to prevent the concentration of the impurities contained in the polycrystalline silicon layer 12a.

It is possible to prevent the silicide formed in the upper portion of the polycrystalline silicon layer 12a from being agglomerated. With this configuration, it is possible to reduce the thinning effect of silicide, and to prevent an increase in the resistance of the gate electrode.

In addition, the thickness of the C-doped layers 12b to 12e is set to 5 nm or less. It is possible to prevent the length of the polycrystalline silicon layer 12a from becoming short by thinning the C-doped layers 12d and 12e provided on both side surfaces of the polycrystalline silicon layer 12a. With this configuration, it is possible to reduce the thinning effect of the polycrystalline silicon layer 12a, and also to prevent an increase in the resistance of the gate electrode 12.

In the ion implantation process of forming the C-doped layers 12d and 12e provided on both side surfaces of the polycrystalline silicon layer 12a, it is possible to prevent carbon (C) from being introduced to the semiconductor substrate 10. With this configuration, it is possible to prevent the interface resistance of the source region 14 and the drain region 15 from increasing.

The first embodiment makes it possible to provide a semiconductor device (MIS transistor) with improved performance.

[2] Second Embodiment

[2-1] Configurations of Semiconductor Device 1

Figure 17:
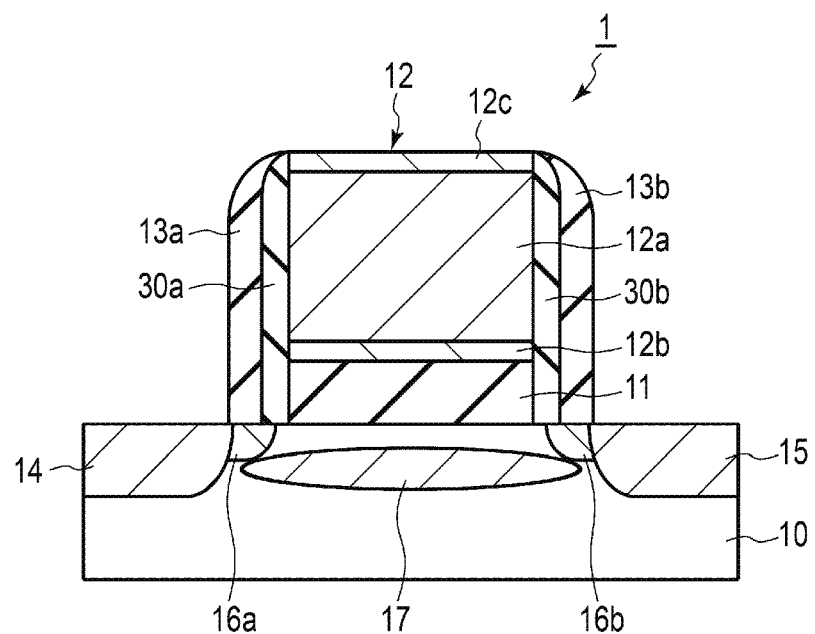
FIG. 17 is a cross-sectional view of the semiconductor device according to at least one embodiment.

FIG. 17 is a cross-sectional view illustrating the semiconductor device 1 according to a second embodiment. The P-type MIS transistor will be described as an example of the semiconductor device 1.

The gate electrode 12 is provided on the gate insulating film 11. The gate electrode 12 includes the polycrystalline silicon layer 12a, and the C-doped layers 12b and 12c which are formed by introducing carbon (C) to polycrystalline silicon. The C-doped layer 12b is provided on the bottom surface of the polycrystalline silicon layer 12a. The C-doped layer 12c is provided on the upper surface of the polycrystalline silicon layer 12a.

N-doped layers 30a and 30b which are formed by introducing nitride (N) to silicon (Si) are provided on both side surfaces of the gate electrode 12 respectively. The N-doped layers 30a and 30b include an insulating material (for example, silicon oxide (SiON)). That is, the polycrystalline silicon layer 12a contained in the gate electrode 12 are wrapped with the C-doped layers 12b and 12c and the N-doped layers 30a and 30b.

The side walls 13a and 13b are provided on the side surfaces of the N-doped layers 30a and 30b respectively.

The extension regions 16a and 16b are provided in the semiconductor substrate 10 and in the regions of the lateral lower sides of the N-doped layers 30a and 30b respectively. The halo region 17 is provided on the lower side of the gate insulating film 11 and between the extension regions 16a and 16b. The source region 14 and a drain region 15 are provided in the semiconductor substrate 10 and the lateral lower sides of the side walls 13a and 13b respectively.

In the semiconductor device 1 configured as described above, the C-doped layers 12b and 12c contained in the gate electrode 12 have a function of preventing the diffusion of the impurities (for example, boron (B)) contained in the polycrystalline silicon layer 12a. In addition, the N-doped layers 30a and 30b provided on both side surfaces of the polycrystalline silicon layer 12a have a function of preventing the diffusion of the impurities contained in the polycrystalline silicon layer 12a. With this configuration, it is possible to prevent the impurities contained in the polycrystalline silicon layer 12a from being diffused.

[2-2] Manufacturing Method of Semiconductor Device 1

Next, a manufacturing method of the semiconductor device 1 according to the second embodiment will be described. The manufacturing process of forming the gate insulating film 11, the C-doped layer 12b, the polycrystalline silicon layer 12a, and the C-doped layer 12c (that is, the manufacturing process of FIGS. 6 and 7) is the same as that of the first embodiment.

Figure 18:
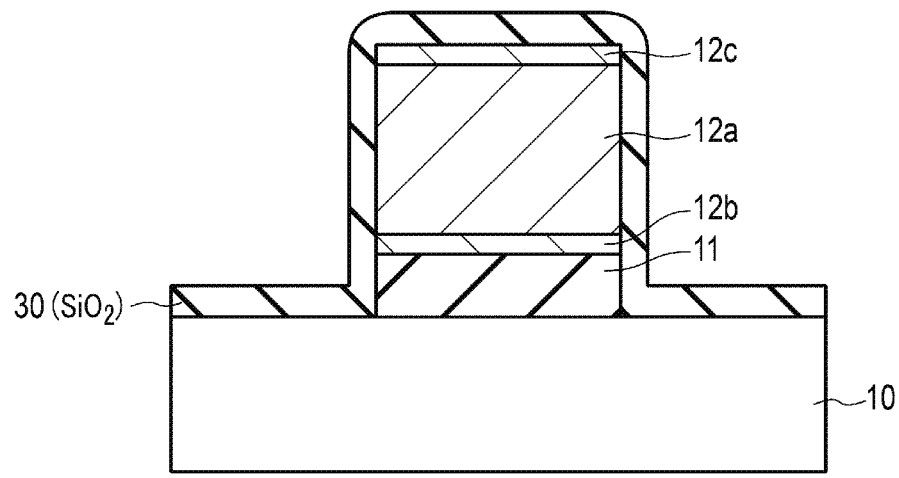
FIG. 18 is a cross-sectional view for describing the manufacturing process of the semiconductor device according to at least one embodiment.

As illustrated in FIG. 18, for example, a silicon-containing insulating film 30 (for example, a silicon oxide (SiO$_2$)) is deposited in the entire surface of the device by the CVD method.

Figure 19:
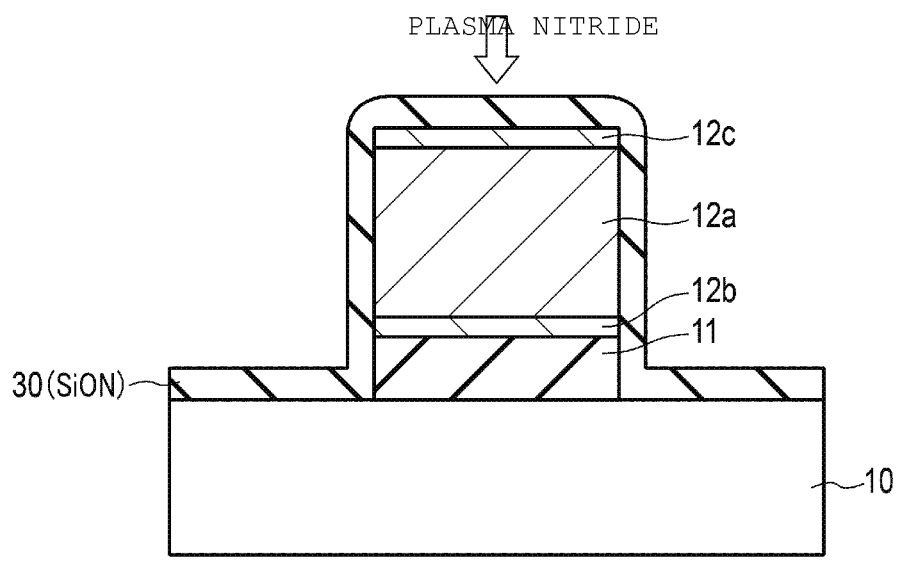
FIG. 19 is a cross-sectional view for describing the manufacturing process of the semiconductor device performed subsequent to FIG. 18.

Subsequently, nitride (N) is introduced to the SiO$_2$ film 30 by a plasma nitride as illustrated in FIG. 19. With this configuration, a silicon oxynitride film (SiON film) 30 is formed to cover the gate electrode 12.

Figure 20:
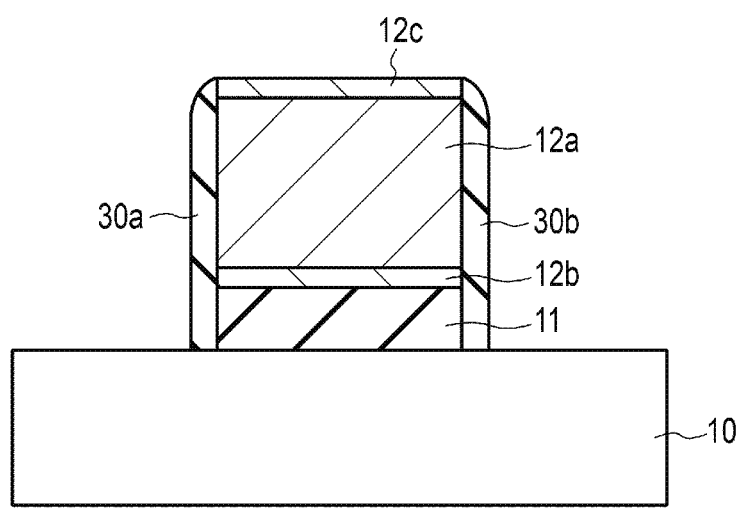
FIG. 20 is a cross-sectional view for describing the manufacturing process of the semiconductor device performed subsequent to FIG. 19.

As illustrated in FIG. 20, for example, the SiON film 30 formed is processed to remain on both side surfaces of the polycrystalline silicon layer 12a by the RIE. With this configuration, the N-doped layers (SiON film) 30a and 30b are formed on both side surfaces of the polycrystalline silicon layer 12a.

Figure 21:
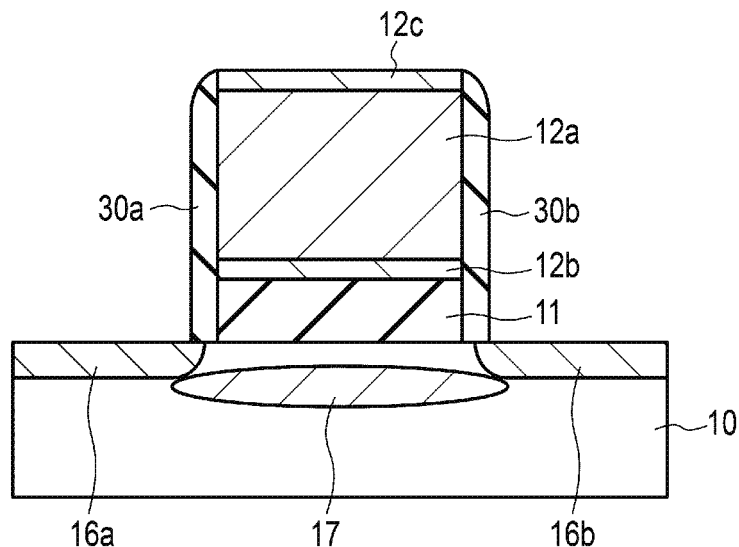
FIG. 21 is a cross-sectional view for describing the manufacturing process of the semiconductor device performed subsequent to FIG. 20.

As illustrated in FIG. 21, the extension regions 16a and 16b and the halo region 17 are formed in the semiconductor substrate 10 using the photo lithography processing.

As illustrated in FIG. 17, the side walls 13a and 13b, the source region 14, and the drain region 15 are formed. These manufacturing processes are the same as those of the first embodiment.

As described above, the semiconductor device 1 according to the second embodiment is manufactured.

[2-3] Effects of Second Embodiment

In the second embodiment, the top and bottom of the polycrystalline silicon layer 12a in the gate electrode 12 are covered by the C-doped layers 12c and 12b, and the both sides thereof are covered by the N-doped layers 30a and 30b.

Therefore, according to the second embodiment, the same effects as those of the first embodiment can be achieved.

In addition, the process of implanting carbon (C) ions to the side surface of the polycrystalline silicon layer 12a is unnecessary. This prevents carbon (C)-induced inactivation of boron (B) in the polycrystalline silicon layer 12a.

In the second embodiment, forming a protection film in the semiconductor substrate 10 is unnecessary. Therefore, the second embodiment can simplify the manufacturing process compared to the first embodiment.

[3] Third Embodiment

[3-1] Configurations of Semiconductor Device 1

Figure 22:
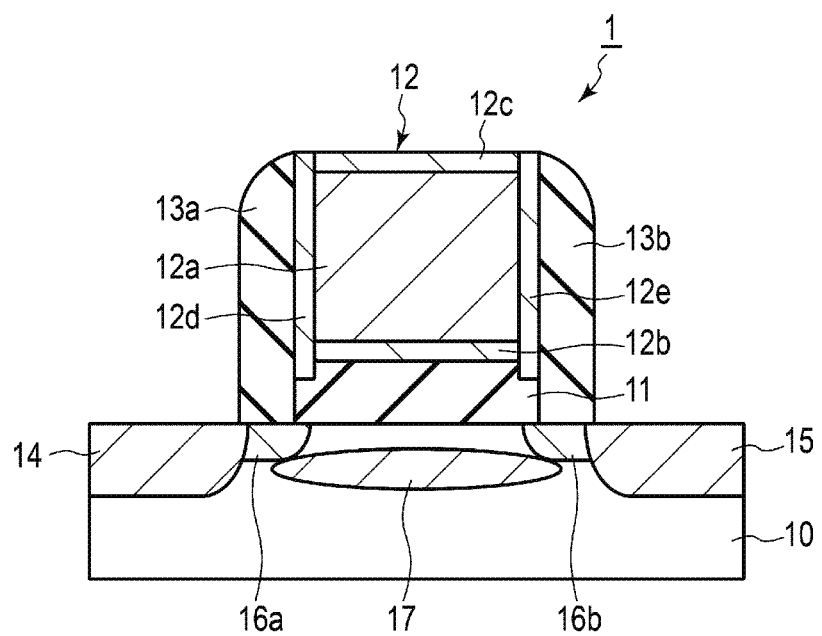
FIG. 22 is a cross-sectional view illustrating the semiconductor device according to at least one embodiment.

FIG. 22 is a cross-sectional view illustrating the semiconductor device 1 according to a third embodiment. The P-type MIS transistor will be described as an example of the semiconductor device 1.

The gate electrode 12 is provided on the gate insulating film 11. The gate electrode 12 includes the polycrystalline silicon layer 12a, the C-doped layers 12b and 12c which is formed by introducing carbon (C) to polycrystalline silicon, and N-doped layers 12d and 12e which are formed by introducing nitride (N) to polycrystalline silicon. The C-doped layer 12b is provided on the bottom surface of the polycrystalline silicon layer 12a. The C-doped layer 12c is provided on the upper surface of the polycrystalline silicon layer 12a. The N-doped layer 12d is provided on one side surface of the polycrystalline silicon layer 12a. The N-doped layer 12e is provided on the other side surface of the polycrystalline silicon layer 12a. That is, the gate electrode 12 has a structure in which the polycrystalline silicon layer 12a is wrapped by the C-doped layers 12b and 12c and the N-doped layers 12d and 12e.

The other configurations are the same as those of the first embodiment.

In the semiconductor device 1 configured as described above, the C-doped layers 12b and 12c contained in the gate electrode 12 have a function of preventing the diffusion of the impurities (for example, boron (B)) contained in the polycrystalline silicon layer 12a. In addition, the N-doped layers 12d and 12e contained in the gate electrode 12 have a function of preventing the diffusion of the impurities contained in the polycrystalline silicon layer 12a. This prevents impurities in the polycrystalline silicon layer 12a from diffusing to the surroundings.

Each of the N-doped layers 12d and 12e is provided such that the concentration of nitride (N) is equal to or more than $1\times10^{20}/cm^3$. When the concentration of nitride (N) is equal to or more than $1\times10^{20}/cm^3$, each of the N-doped layers 12d and 12e can prevent the diffusion of the impurities (for example, boron (B)) contained in the polycrystalline silicon layer 12a.

The thickness of each of the N-doped layers 12d and 12e is desirably set to be equal to or less than 5 nm. When the thickness of each of the N-doped layers 12d and 12e is 5 nm, it is possible to prevent the diffusion of the impurities. In this embodiment, the thickness of each of the N-doped layers 12d and 12e is set to be equal to or less than 5 nm. Even when the thickness of each of the N-doped layers 12d and 12e is equal to or less than 5 nm, it is possible to prevent the diffusion of the impurities.

[3-2] Manufacturing Method of Semiconductor Device 1

Next, a manufacturing method of the semiconductor device 1 according to the third embodiment will be described. The manufacturing process (the manufacturing process of FIGS. 6 to 10) performed to expose the side surface of the polycrystalline silicon layer 12a is the same as that of the first embodiment.

Figure 23:
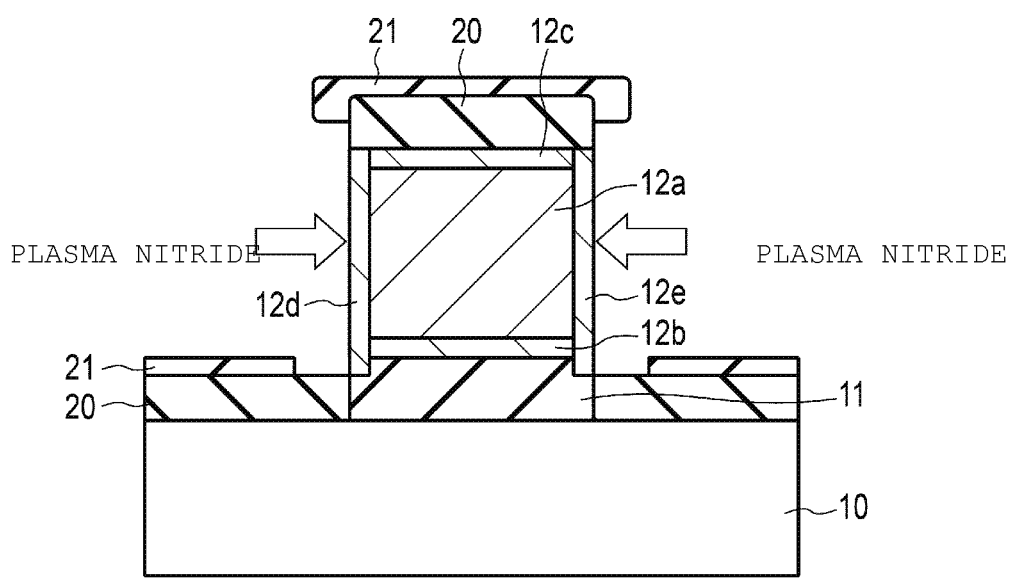
FIG. 23 is a cross-sectional view for describing the manufacturing process of the semiconductor device according to at least one embodiment.

As illustrated in FIG. 23, nitride (N) is introduced to both side surfaces of the polycrystalline silicon layer 12a by the plasma nitride. With this configuration, the N-doped layers 12d and 12e are formed on both side surfaces of the polycrystalline silicon layer 12a respectively.

At this time, the semiconductor substrate 10 is protected by the insulating films 20 and 21. Therefore, it is possible to prevent that nitride (N) is introduced to the semiconductor substrate 10. In addition, the C-doped layer 12c provided on the upper surface of the polycrystalline silicon layer 12a is protected by the insulating films 20 and 21. Therefore, it is possible to prevent that nitride (N) is introduced to the C-doped layer 12c.

The subsequent manufacturing process is the same as that of the first embodiment. Therefore, the semiconductor device 1 illustrated in FIG. 22 is manufactured.

[3-3] Effects of Third Embodiment

In the third embodiment, the top and bottom of the polycrystalline silicon layer 12a in the gate electrode 12 are covered by the C-doped layers 12c and 12b, and the both sides thereof are covered by the N-doped layers 12d and 12e.

Therefore, according to the third embodiment, the same effects as those of the first embodiment can be achieved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a semiconductor substrate;
   a gate insulating film on the semiconductor substrate; and
   a gate electrode on the gate insulating film, wherein
   the gate electrode includes
      a first layer containing polycrystalline silicon,
      a second layer between the first layer and the gate insulating film and containing polycrystalline silicon and carbon,
      a third layer on an upper surface of the first layer and containing polycrystalline silicon and carbon,
      a fourth layer on a first side surface of the first layer and containing polycrystalline silicon and carbon, and
      a fifth layer on a second side surface of the first layer and containing polycrystalline silicon and carbon.

2. The semiconductor device according to claim 1, wherein a thickness of each of the second to fifth layers is equal to or less than 5 nm.

3. The semiconductor device according to claim 1, wherein the first layer is wrapped by the second to fifth layers.

4. The semiconductor device according to claim 1, further comprising:
   insulating side walls contacting sides of the gate electrode.

5. The semiconductor device according to claim 4, wherein the insulating side walls include silicon oxide.

6. The semiconductor device according to claim 1, wherein a concentration of the carbon is equal to or more than $1\times10^{20}/cm^3$.

7. The semiconductor device according to claim 1, further comprising:
   the semiconductor substrate including a first area of a first conductivity type;
   a second area of a second conductivity type being provided on the first area;

a third area of the second conductivity type being provided on the first area, the third area being arranged apart from the second area in a first direction parallel to a surface of the substrate;

a fourth area of the second conductivity type being provided between the first area and the second area; and a fifth area of the second conductivity type being provided between the first area and the third area.

8. The semiconductor device according to claim 7, wherein a concentration of the fourth area is less than a concentration of the second area.

9. The semiconductor device according to claim 7, wherein a depth of the fourth area is less than a depth of the second area in a second direction vertical to the surface of the substrate.

10. The semiconductor device according to claim 7, wherein the first area includes a sixth area of the first conductivity type, the sixth area provided below the gate insulating film.

11. The semiconductor device according to claim 10, wherein a concentrate of the sixth area is higher than a concentrate of the first area.

12. A semiconductor device, comprising:
a semiconductor substrate;
a gate insulating film on the semiconductor substrate; and
a gate electrode on the gate insulating film, wherein the gate electrode includes
 a first layer containing polycrystalline silicon,
 a second layer on a bottom surface of the first layer and containing polycrystalline silicon and carbon,
 a third layer on an upper surface of the first layer and containing polycrystalline silicon and carbon,
 a fourth layer on a first side surface of the first layer and containing polycrystalline silicon and nitride, and
 a fifth layer on a second side surface of the first layer and containing polycrystalline silicon and nitride.

13. The semiconductor device according to claim 12, wherein a concentration of the nitride is equal to or more than $1 \times 10^{20}/cm^3$.

14. The semiconductor device according to claim 12, wherein a thickness of each of the second to fifth layers is equal to or less than 5 nm.

15. The semiconductor device according to claim 12, wherein the first layer is wrapped by the second to fifth layers.

16. The semiconductor device according to claim 12, further comprising:
insulating side walls contacting sides of the gate electrode.

17. The semiconductor device according to claim 16, wherein the insulating side walls include silicon oxide.

18. The semiconductor device according to claim 12, wherein a concentration of the carbon is equal to or more than $1 \times 10^{20}/cm^3$.

19. The semiconductor device according to claim 12, wherein the fourth layer and the fifth layer extend to partially cover side surfaces of the gate insulating film.

20. The semiconductor device according to claim 12, wherein the fourth layer and the fifth layer extend to entirely cover side surfaces of the gate insulating film.

* * * * *